(12) United States Patent
Hsieh et al.

(10) Patent No.: US 11,690,232 B2
(45) Date of Patent: Jun. 27, 2023

(54) HIGH DENSITY MEMORY DEVICES WITH LOW CELL LEAKAGE AND METHODS FOR FORMING THE SAME

(71) Applicant: Taiwan Semiconductor Manufacturing Company Limited, Hsinchu (TW)

(72) Inventors: Te-Hsien Hsieh, Hsinchu (TW); Yuan-Tai Tseng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 256 days.

(21) Appl. No.: 16/885,346

(22) Filed: May 28, 2020

(65) Prior Publication Data

US 2021/0375993 A1    Dec. 2, 2021

(51) Int. Cl.
*H01L 45/00*    (2006.01)
*H10B 63/00*    (2023.01)
*H10N 70/20*    (2023.01)
*H10N 70/00*    (2023.01)

(52) U.S. Cl.
CPC ............ *H10B 63/84* (2023.02); *H10B 63/24* (2023.02); *H10N 70/063* (2023.02); *H10N 70/24* (2023.02); *H10N 70/826* (2023.02); *H10N 70/841* (2023.02); *H10N 70/8833* (2023.02); *H10N 70/8836* (2023.02)

(58) Field of Classification Search
CPC .. H01L 27/2472; H01L 45/146; H10N 70/826
See application file for complete search history.

(56) References Cited

U.S. PATENT DOCUMENTS 10,777,608 B2 *    9/2020    Lu ............................ G11C 7/12

* cited by examiner

*Primary Examiner* — Mark V Prenty
(74) *Attorney, Agent, or Firm* — The Marbury Law Group, PLLC

(57) ABSTRACT

A memory device including a first array of rail structures that extend along a first horizontal direction, in which each of the rail structures are formed to serve as a bottom electrode, and a second array of rail structures that laterally extend along a second horizontal direction and are laterally spaced apart along the first horizontal direction. Each of the rail structures in the second array are formed to server as a top electrode. The memory device also includes a continuous dielectric memory layer located between the first array of rail structures and the second array of rail structures. The continuous dielectric memory layer providing protection from current leakage between the rail structures of the first array and the rail structures of the second array.

19 Claims, 16 Drawing Sheets

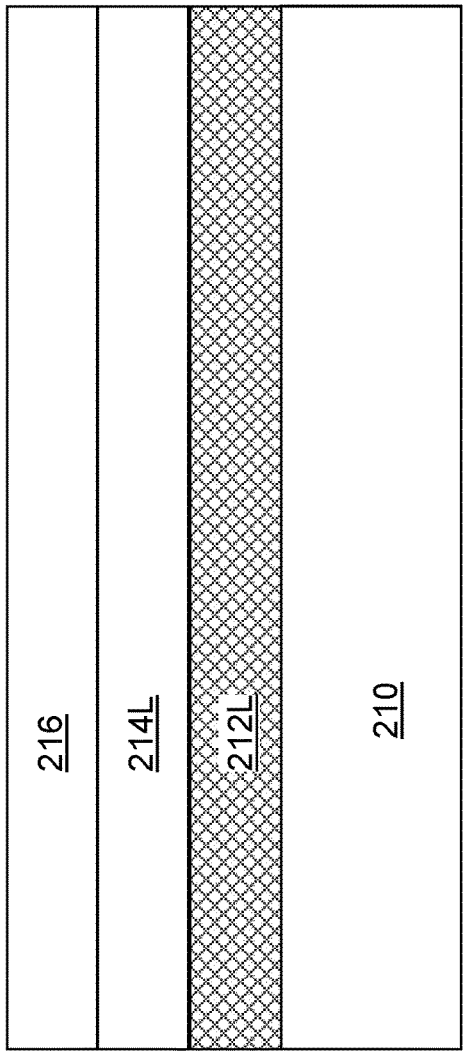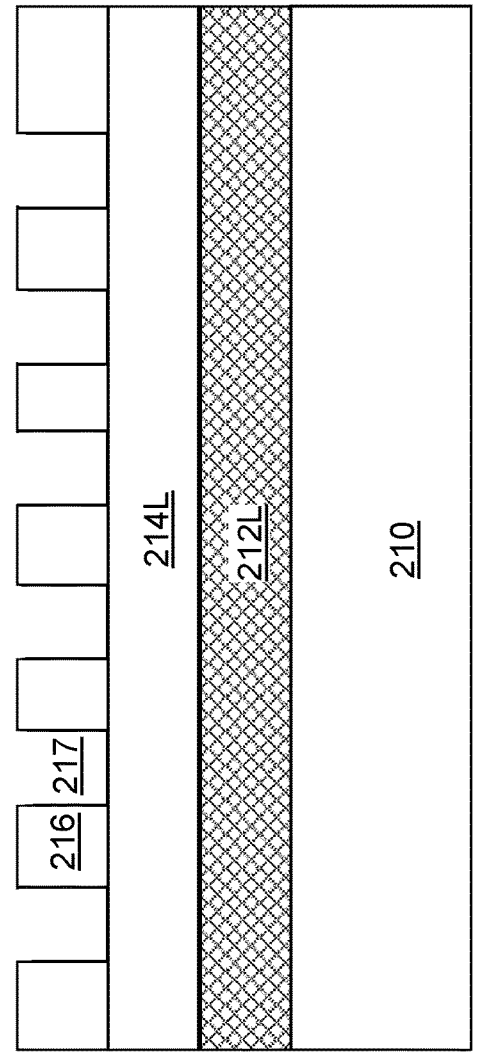

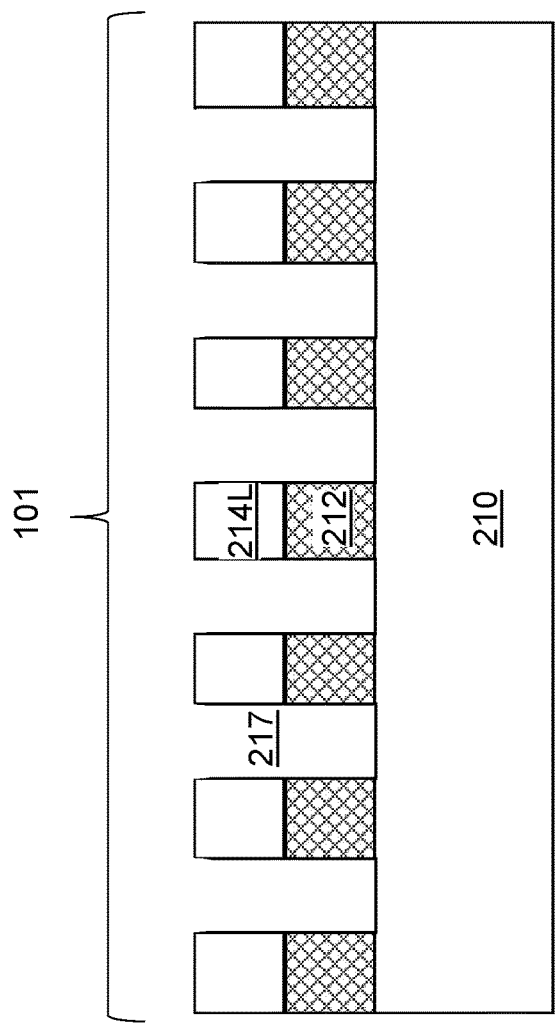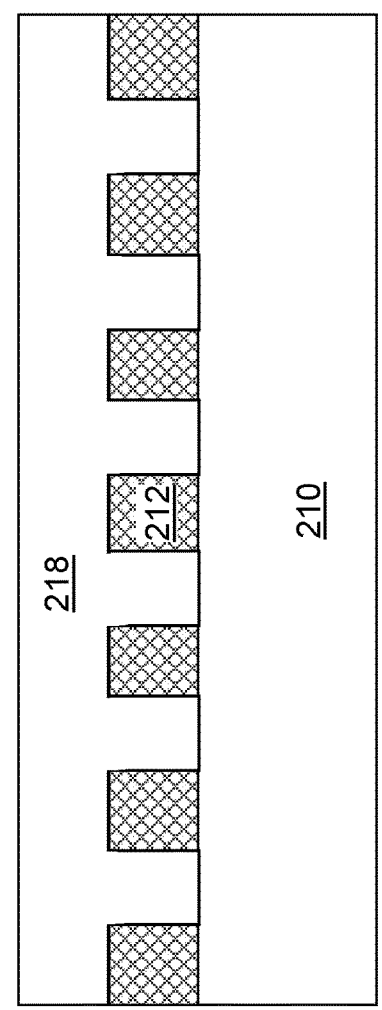

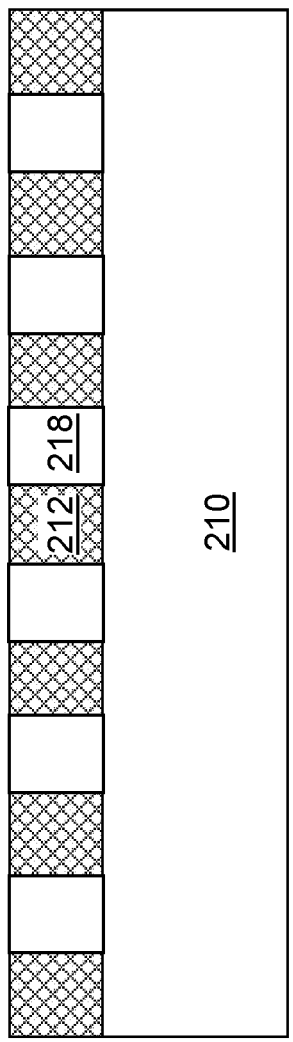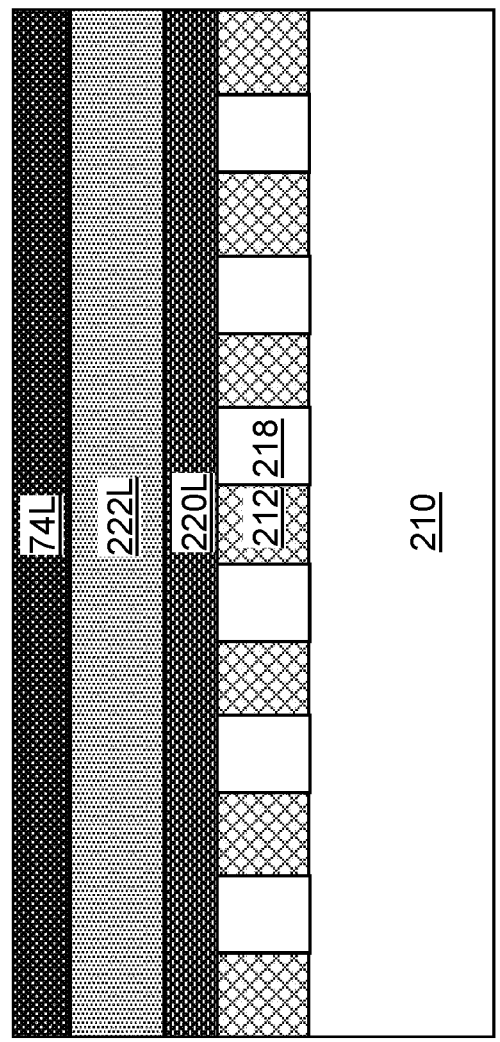

HIGH DENSITY MEMORY DEVICES WITH LOW CELL LEAKAGE AND METHODS FOR FORMING THE SAME

BACKGROUND

Resistive memory devices employ a memory element that can provide at least two resistive states by providing different levels of electrical resistance. Some methods of fabricating a memory device having a resistive memory element result in memory cells with high current leakage. Other methods reduce the current leakage but inhibit the scaling of resistive memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is vertical cross-sectional view of a portion of a memory array region after deposition of a continuous bottom electrode layer, a hard mask layer and a photoresist layer.

FIG. 2B is a vertical cross-sectional view of the portion of the memory array region illustrating patterning of the photoresist layer.

FIG. 2C is a vertical cross-sectional view of the portion of the memory array region illustrating patterning of the hard mask layer and the continuous bottom electrode layer.

FIG. 2D is a vertical cross-sectional view of the portion of the memory array region with the hard mask removed and a first dielectric layer and deposition of a first dielectric layer.

FIG. 2E is a vertical cross-sectional view of the portion of the memory array region after planarizing the memory array region.

FIG. 2F is a vertical cross-sectional view of the portion of the memory array region after deposition of a continuous resistive memory layer and a continuous top electrode layer.

DETAILED DESCRIPTION

Figure 1A:
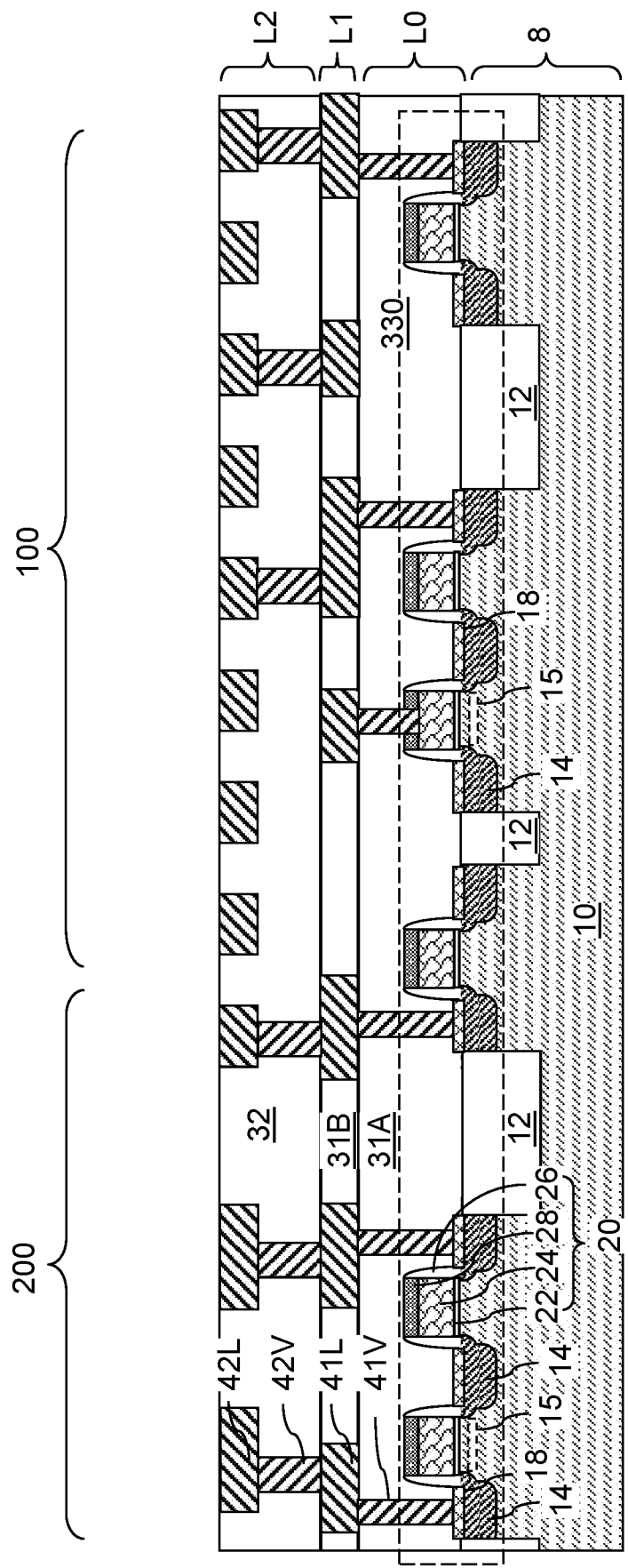
FIG. 1A is a vertical cross-sectional view of a first exemplary structure during prior to formation of an array of resistive memory elements according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to resistive memory devices with low cell leakage and methods of forming the same.

Generally, the structures and methods of the present disclosure can be used to form at least one layer of a two-dimensional array of resistive memory elements in a metal interconnect level. The resistive memory may include a continuous layer of a dielectric material that may have a plate shape that spans the full length and width of a first two-dimensional array of resistive memory elements and a second two dimensional array of resistive memory elements. The use of a continuous plate shaped dielectric material layer allows for the fabrication of memory devices with low cell leakage while also providing a higher cell density than previously attainable.

Previous methods of fabricating resistive memory devices include a step of anisotropically etching a continuous layer of dielectric material to form discrete dielectric elements between the top and bottom electrodes. In a direct cut method, a top electrode may be formed by anisotropic etching that progresses until the top surface of the bottom electrode is reached. Typically, the top surface of the bottom electrode may be etched before the anisotropic etching process is halted. As a result, the conductive material from the formed bottom electrode may be sputtered on the sidewalls of the discrete dielectric elements and sidewalls of the top electrodes. While the direct cut method allows for good cell density, the resulting sputtered material may create a high risk of leakage current between the bottom and top electrodes.

In order to prevent risk of current leakage due to sputtered material, an alternative sidewall spacer method may be used. In such a method, sidewall spacers may be provided to the sidewalls of the top electrodes prior to etching the continuous dielectric material layer. This method reduces the risk of current leakage from the cells relative to the direct cut method because the sidewall spacers provide added electrical insulation. However, the sidewall spacer method results in a lower cell density compared to the direct cut method due to the extra real estate allocated to the sidewall spacers.

In an embodiment, the bit lines may be used as bottom electrodes for the resistive memory elements. Each bit line may be provided within a respective rail structure. The rail structures may be arranged as columns that laterally extend along a first horizontal direction. Dielectric isolation structures may be formed between the columns of rail structures. A layer stack including a resistive memory material layer and a selector material layer may be formed in each line trench located between each neighboring pair of dielectric isolation structures. Word lines extending in a second horizontal direction may be formed on a respective layer stack of a resistive memory material layer and a selective material layer. Each portion of a resistive memory material layer located between a neighboring pair of a bit line and a word line may constitute a memory element. The bit lines and the word lines are electrically connected to one or the other of the bottom electrodes or the top electrodes. Multiple two-dimensional arrays of resistive memory elements may be stacked over multiple metal interconnect levels to provide a three-dimensional array of resistive memory elements. Various features of the structures and methods of the present disclosure are described in detail herein below.

Referring to FIG. 1A, a first exemplary structure according to an embodiment of the present disclosure is illustrated prior to formation of an array of resistive memory elements. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which can include a memory array region 100 in which at least one array of resistive memory elements may be subsequently formed. The exemplary structure may also include a peripheral region 200 in which electrical connections between each array of resistive memory elements and a peripheral circuit including field effect transistors may be subsequently formed. Areas of the memory array region 100 and the peripheral region 200 may be employed to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 can include a vertical stack of a gate dielectric 22, a gate electrode 24, and a gate cap dielectric 28, which is herein referred to as a gate stack (22, 24, 28). Ion implantation processes can be performed to form extension implant regions, which can include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 can be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor can include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the semiconductor material layer 10, which may include a periphery circuit for the array(s) of resistive memory elements to be subsequently formed.

Various interconnect-level structures may be subsequently formed, which are formed prior to formation of an array of resistive memory elements and are herein referred to as lower interconnect-level structures (L0, L1, L2). In case a two-dimensional array of resistive memory elements is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 includes a second interconnect-level dielectric layer 32, which may include a stack of a first via-level dielectric material layer and a second line-level dielectric material layer or a line-and-via-level dielectric material layer. The second interconnect-level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect-level dielectric layer 32.

Figure 1B:
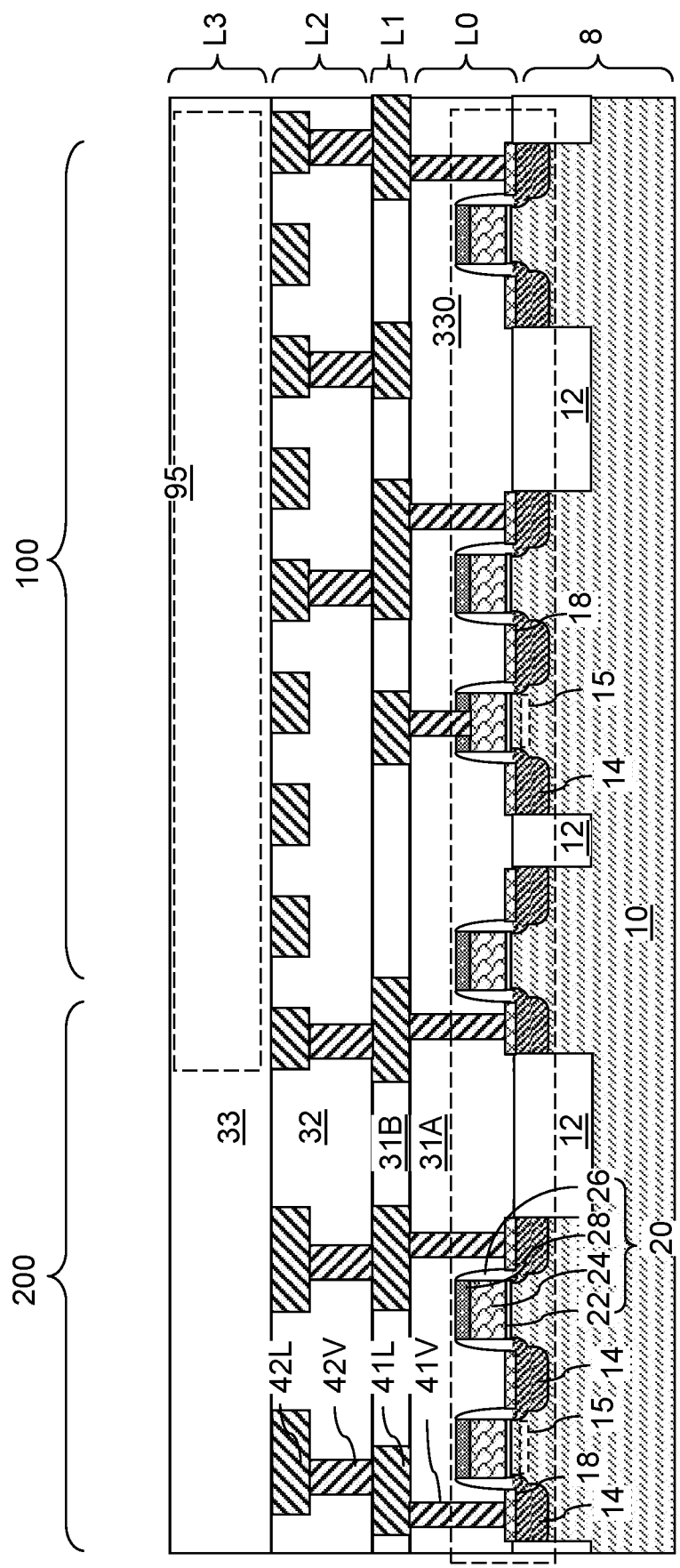
FIG. 1B is a vertical cross-sectional view of the first exemplary structure during after formation of the array of resistive memory elements according to an embodiment of the present disclosure.

Referring to FIG. 1B, an array 95 of resistive memory elements may be formed in the memory array region 100 over the second interconnect-level structure L2. The details for the structure and the processing steps for the array 95 of resistive memory elements are subsequently described in detail below. A third interconnect-level dielectric layer 33 may be formed during formation of the array 95 of resistive memory elements. The set of all structures formed at the level of the array 95 of resistive memory elements is herein referred to as a third interconnect-level structure L3.

Figure 1C:
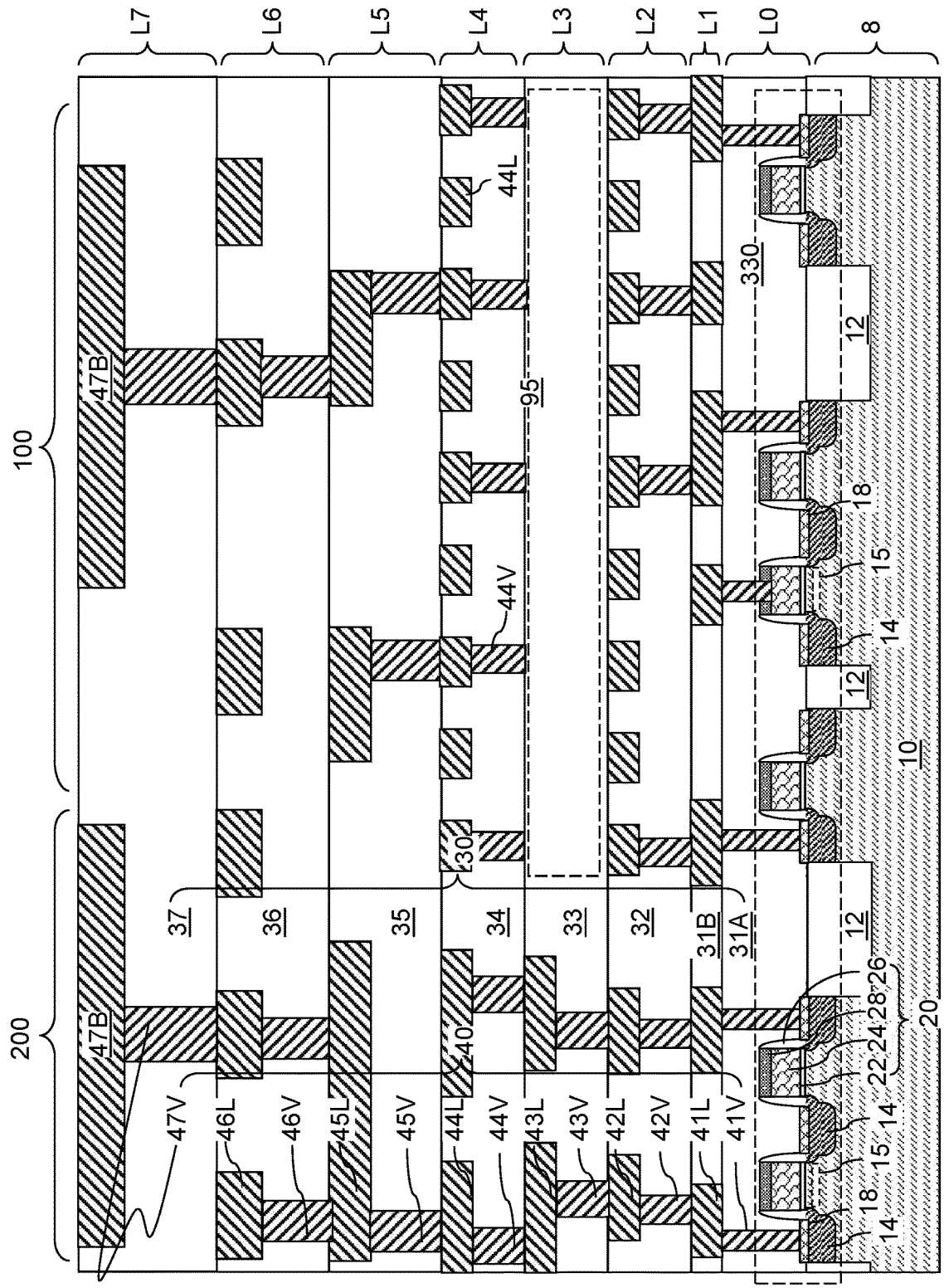
FIG. 1C is a vertical cross-sectional view of the first exemplary structure during after formation of upper-level metal interconnect structures according to an embodiment of the present disclosure.

Referring to FIG. 1C, third interconnect-level metal interconnect structures (43V, 43L) may be formed in the third interconnect-level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect-level dielectric layer 34 having formed therein fourth interconnect-level metal interconnect structures (44V, 44L), which can include third metal via structures 44V and fourth metal lines 44L. The fifth interconnect-level structure L5 may include a fifth interconnect-level dielectric layer 35 having formed therein fifth interconnect-level metal interconnect structures (45V, 45L), which can include fourth metal via structures 45V and fifth metal lines 45L. The sixth interconnect-level structure L6 may include a sixth interconnect-level dielectric layer 36 having formed therein sixth interconnect-level metal interconnect structures (46V, 46L), which can include fifth metal via structures 46V and sixth metal lines 46L. The seventh interconnect-level structure L7 may include a seventh interconnect-level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of resistive memory elements may be formed as a component of a third interconnect-level structure L3, embodiments are expressly contemplated herein in which the array 95 of resistive memory elements may be formed as components of any other interconnect-level structure (e.g., L1-L7). Further, while the present disclosure is described employing an embodiment in which a set of eight interconnect-level structures are formed, embodiments are expressly contemplated herein in which a different number of interconnect-level structures is employed. In addition, embodiments are expressly contemplated herein in which two or more arrays 95 of resistive memory elements are provided within multiple interconnect-level structures in the memory array region 100. While the present disclosure is described employing an embodiment in which an array 95 of resistive memory elements is formed in a single interconnect-level structure, embodiments are expressly contemplated herein in which an array 95 of resistive memory elements may be formed over two vertically adjoining interconnect-level structures.

FIGS. 2A-2F and 3A-3E illustrate a method of making a resistive memory device according various embodiments. As discussed in more detail below, the resistive memory device includes an array of memory cells that share a common continuous high-k dielectric layer rather than each memory cell having a discrete high-k dielectric memory portion. Referring to FIG. 2A, a continuous bottom electrode material layer 212L may be deposited on the lower interconnect-level structures (L0, L1, L2), collectively referred to as lower interconnect-level structures 210. That is, the continuous bottom electrode material layer 212L may be deposited as a first layer in a process of forming the array 95 of resistive memory elements located over the lower interconnect-level structures 210 (e.g., L2 in FIG. 1A-1C). The continuous bottom electrode material layer 212L may include a metallic material such as a conductive metallic nitride (such as TiN, TaN or WN) or a combination of a conductive metallic nitride and an elemental metal, such as W, Ti, Cu, Co, Mo, or Ru and mixtures thereof. Other suitable materials within the contemplated scope of the disclosure may also be used. The continuous bottom electrode material layer 212L may be deposited by any suitable method, such a chemical vapor deposition (CVD), plasma-enhanced chemical vapor deposition (PECVD), etc. Next, a continuous hard mask layer 214L may be deposited over the continuous bottom electrode layer 212L. The continuous hard mask layer 214L may include amorphous carbon, organo siloxane based materials, SiN, SiON or combinations thereof. The continuous hard mask layer 214L may be deposited by CVD, a spin-on process or any other suitable process. A photoresist layer 216 may be deposited over the continuous hard mask layer 214L. The photoresist layer 216 may be deposited by any suitable method.

Referring to FIG. 2B, the photoresist layer 216 may be lithographically patterned to form trenches 217 exposing stripes the top surface of the continuous hard mask layer 214L located between walls of photoresist layer 216. Referring to FIG. 2C, the continuous hard mask layer 214L and the continuous bottom electrode material layer 212L may then be etched though the trenches 217 in the photoresist layer 216 to extend the trenches to the lower interconnect-level structures 210. In this manner, the continuous bottom electrode material layer 212L may be patterned into a first array 101 of bottom electrode rails structures 212. In an embodiment, the bottom electrode rails 212 may also function as bit lines. The spacing between each laterally neighboring pair of bottom electrode rails 212 can be in the range from 20 nm to 100 nm, although lesser and greater spacings can also be used.

Referring to FIG. 2D, the remaining portions of the continuous hard mask layer 214L may be removed, such as by selective etching. A first dielectric material 218 may be deposited in the trenches 217 and over the bottom electrode rails 212. The first dielectric material 218 may include silicon oxide, silicon oxynitride, and/or a low-k dielectric material such as organosilicate glass. Other suitable materials for the first dielectric material 218 are within the contemplated scope of disclosure. Referring to FIG. 2E, a planarization step may be performed to expose the top surface of the bottom electrode rails 212. The planarization step may be performed by chemical mechanical polishing or any other suitable method.

Referring to FIG. 2F, a continuous dielectric memory layer 220L may be deposited over the planarized bottom electrode rails 212 and first dielectric material 218. The continuous dielectric memory layer 220L is made of a high-k dielectric constant material, such as a material with a dielectric constant "k" in the range of 7-100. Exemplary high dielectric materials include alumina ($Al_2O_3$), hafnia ($HfO_2$), zirconia ($ZrO_2$), titanium dioxide ($TiO_2$), tantalum oxide ($Ta_2O_5$) and SZO ($SrZrO_3$) and any other suitable dielectric switching material. A continuous top electrode material layer 222L may then deposited over the continuous dielectric memory layer 220L. The continuous top electrode material layer 222L may include a metallic material such as a conductive metallic nitride (such as TiN, TaN or WN) or a combination of a conductive metallic nitride and an elemental metal, such as W, Ti, Cu, Co, Mo, or Ru and mixtures thereof. Other suitable materials for use as a metallic liner and metallic fill material are within the contemplated scope of disclosure.

A continuous selector material layer 74L may be formed over the continuous top electrode material layer 222L. The continuous selector material layer 74L may include a selector material that may provide electrical connection or electrical disconnection depending on an applied bias voltage thereacross. In one embodiment, the continuous selector material layer 74L may include a phase change memory material that can provide two different resistive states depending on the crystalline structure. For example, the continuous selector material layer 74L can include an ovonic threshold switch material that functions as a conductor under a voltage bias thereacross that exceeds a threshold switching voltage, and functions as an insulator under a voltage bias thereacross that is less than the threshold switching voltage. For example, the continuous selector material layer 74L can include a chalcogenide alloy including selenium or tellurium and at least another element such as zinc, germanium, silicon, and optionally includes sulfur and/or nitrogen. In one embodiment, the continuous selector material layer 74L may include zinc telluride or zinc selenide telluride. Alternatively, the continuous selector material layer 74L may include a p-n junction diode material, which can include at least one layer stack of a p-doped semiconductor material and an n-doped semiconductor material. The continuous selector material layer 74L may be formed by a conformal deposition process such as chemical vapor deposition. The thickness of the continuous selector material layer 74L may be in a range from 3 nm to 30 nm, although lesser and greater thicknesses can also be used. Generally, each of the continuous high-k dielectric memory material layer 220L and the continuous selector material layer 74L may be formed by a respective conformal deposition process. While the present disclosure is described using an embodiment in which the continuous selector material layer 74L may be formed on the continuous resistive memory material layer 220L, embodiments are expressly contemplated herein in which the continuous selector material layer 74L is deposited first, and the continuous resistive memory material layer 220L is deposited on the continuous selector material layer 74L.

Figure 3A:
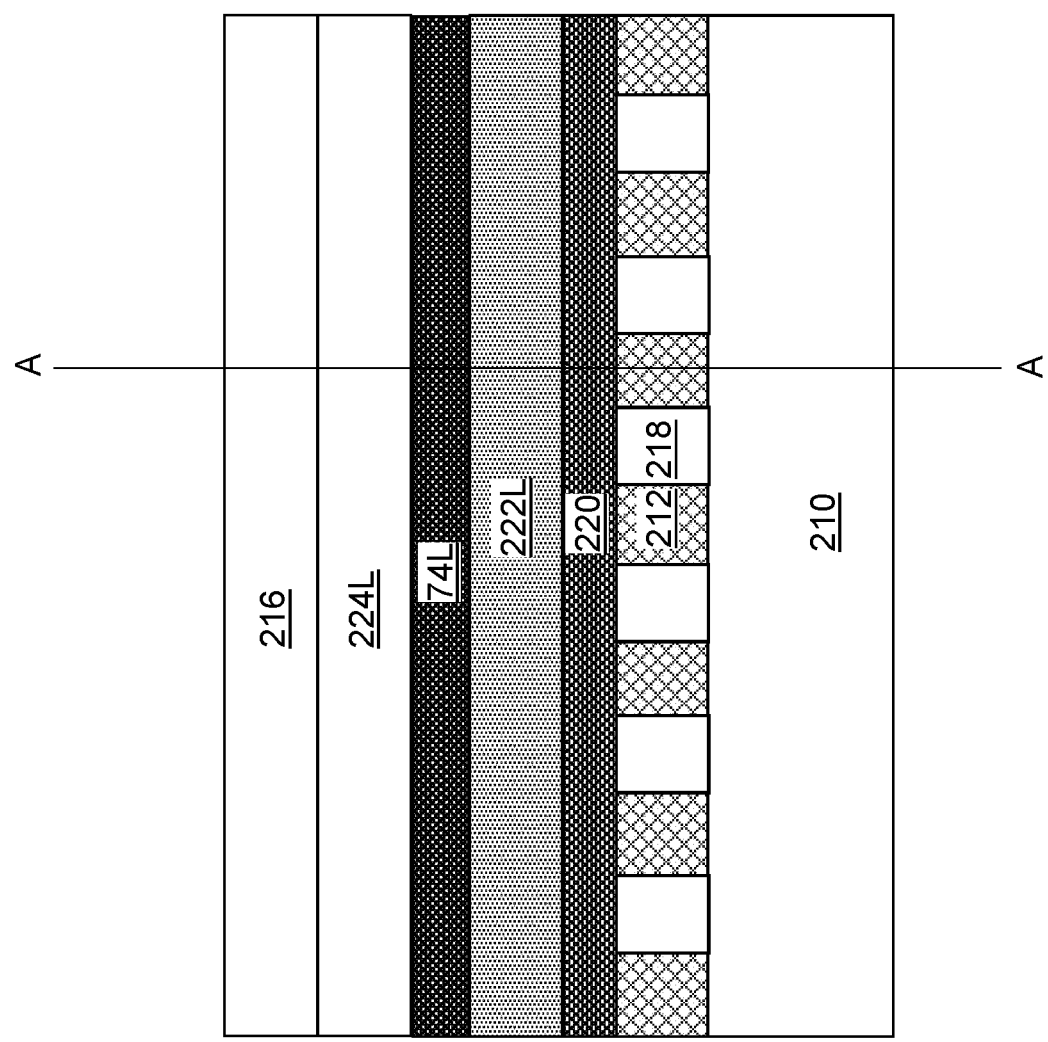
FIG. 3A is a vertical cross-sectional view of the portion of the memory array region after deposition of a hard mask layer and a photoresist layer.

Referring to FIG. 3A, a second continuous hard mask layer 224L may be deposited over the continuous bottom electrode material layer 222L. The second continuous hard mask layer 224L may be made of the same material as the first hard mask layer 214L or it may be different. Next, a photoresist layer 216 may be deposited over the second continuous hard mask layer 224L.

Figure 3B:
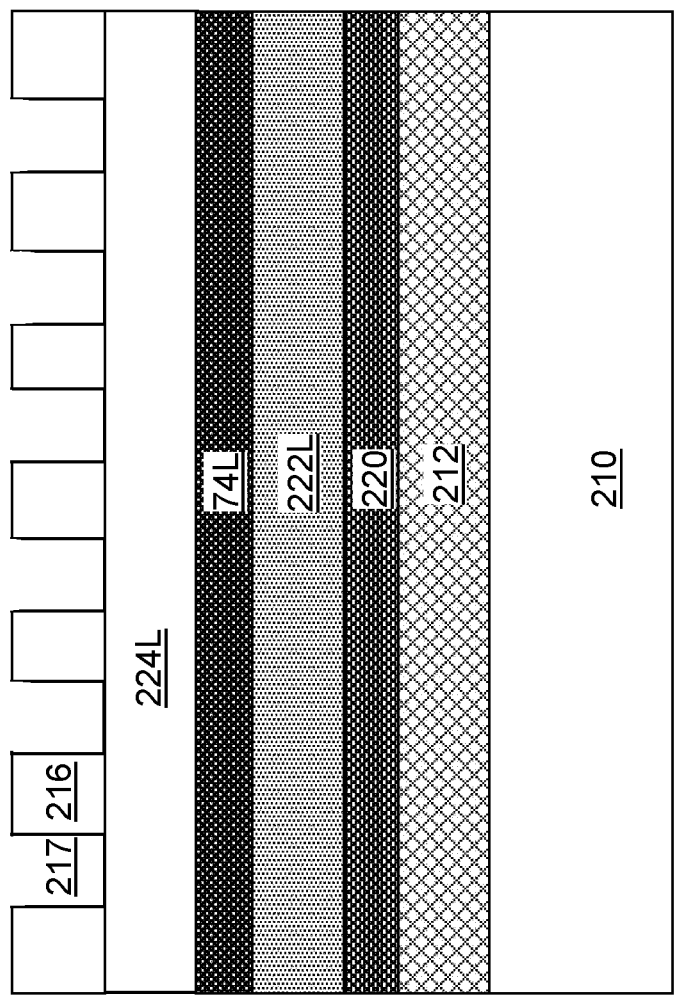
FIG. 3B is a vertical cross-sectional view of the portion of the memory array region after patterning the photoresist.
Figure 3C:
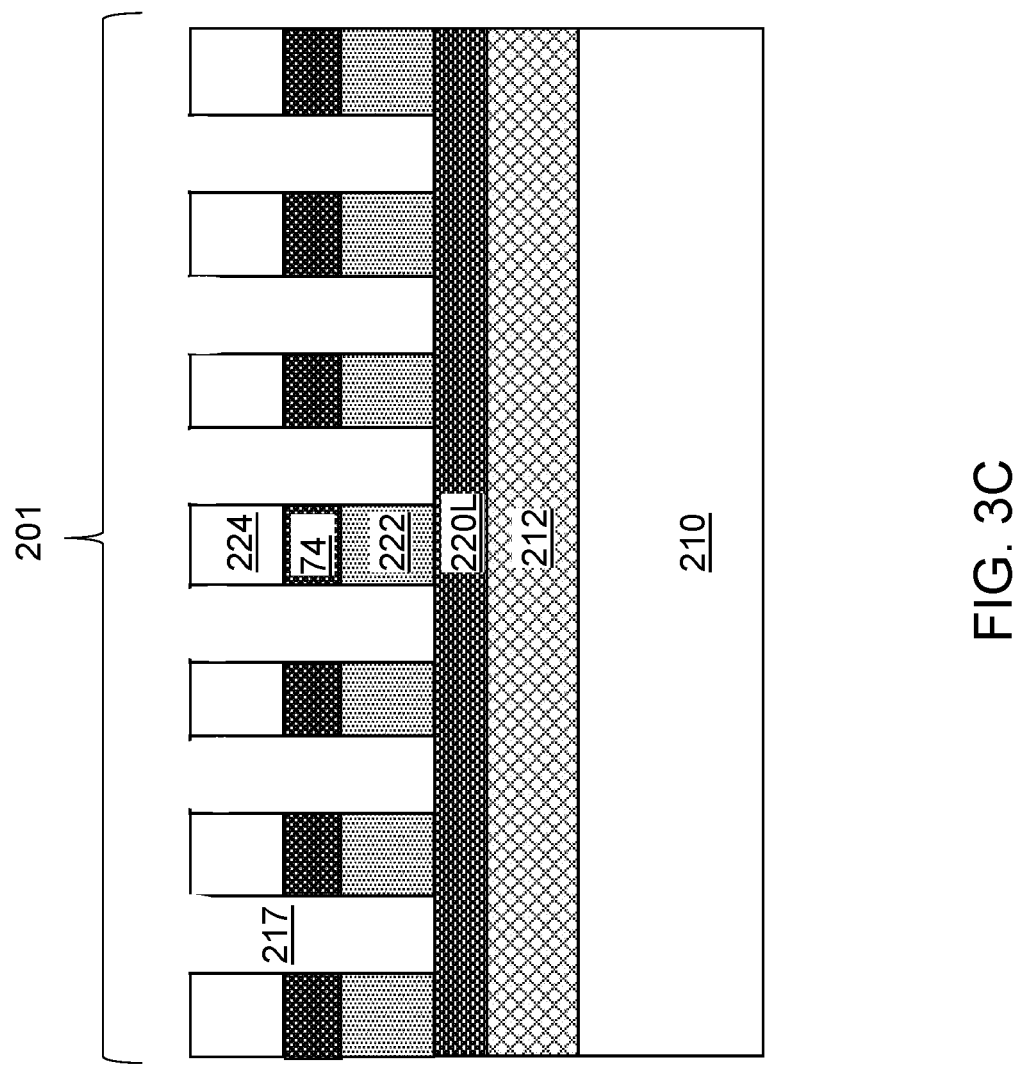
FIG. 3C is a vertical cross-sectional view of the portion of the memory array region after patterning of the continuous hard mask layer and the top electrode layer.

Referring to FIG. 3B, the photoresist layer 216 may be photolithographically patterned to form trenches 217 in the photoresist layer 216 exposing stripes on a top surface of the hard mask layer 224L. The view of the structure may be rotated 90 degrees from the view of the structure shown in FIG. 3A. Referring to FIG. 3C, the second continuous hard mask layer 224L and the continuous top electrode material layer 222L may be etched to form trenches 217 in the second continuous hard mask layer 224 and the continuous top electrode material layer 222L that expose the top surface of the continuous resistive memory layer 220L. In this manner, the continuous top electrode material layer 222L may be patterned into a second array 201 of top electrode rails structures 222. After forming the trenches 217, the remaining photoresist material 216 may be removed, such as by ashing.

Figure 3D:
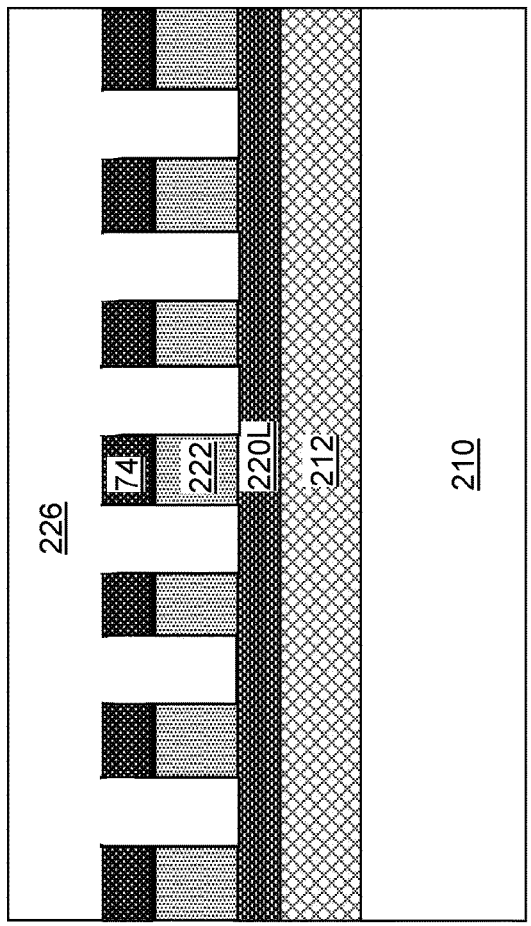
FIG. 3D is a vertical cross-sectional view of the portion of the memory array region after deposition of a second dielectric layer over the top electrodes.
Figure 3E:
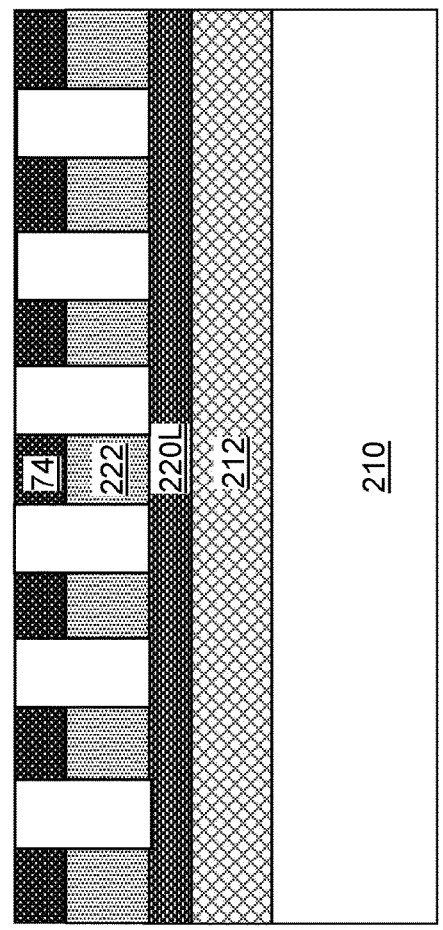
FIG. 3E is a vertical cross-sectional view of the portion of the memory array region along after planarization of the top electrode layer.

Referring to FIG. 3D, Then, a second dielectric material 226 may be deposited in the trenches 217 and over the top electrode rails 222. The second dielectric material 226 may include silicon oxide, silicon oxynitride, and/or a low-k dielectric material such as organosilicate glass. Other suitable materials for the second dielectric material 226 are within the contemplated scope of disclosure. The second dielectric material 226 may be the same as or different from the first dielectric material 218. Referring to FIG. 3E, a planarization step is performed to expose the top surface of the top electrode rails 222. The planarization step may be performed by chemical mechanical polishing or any other suitable method.

Figure 4:
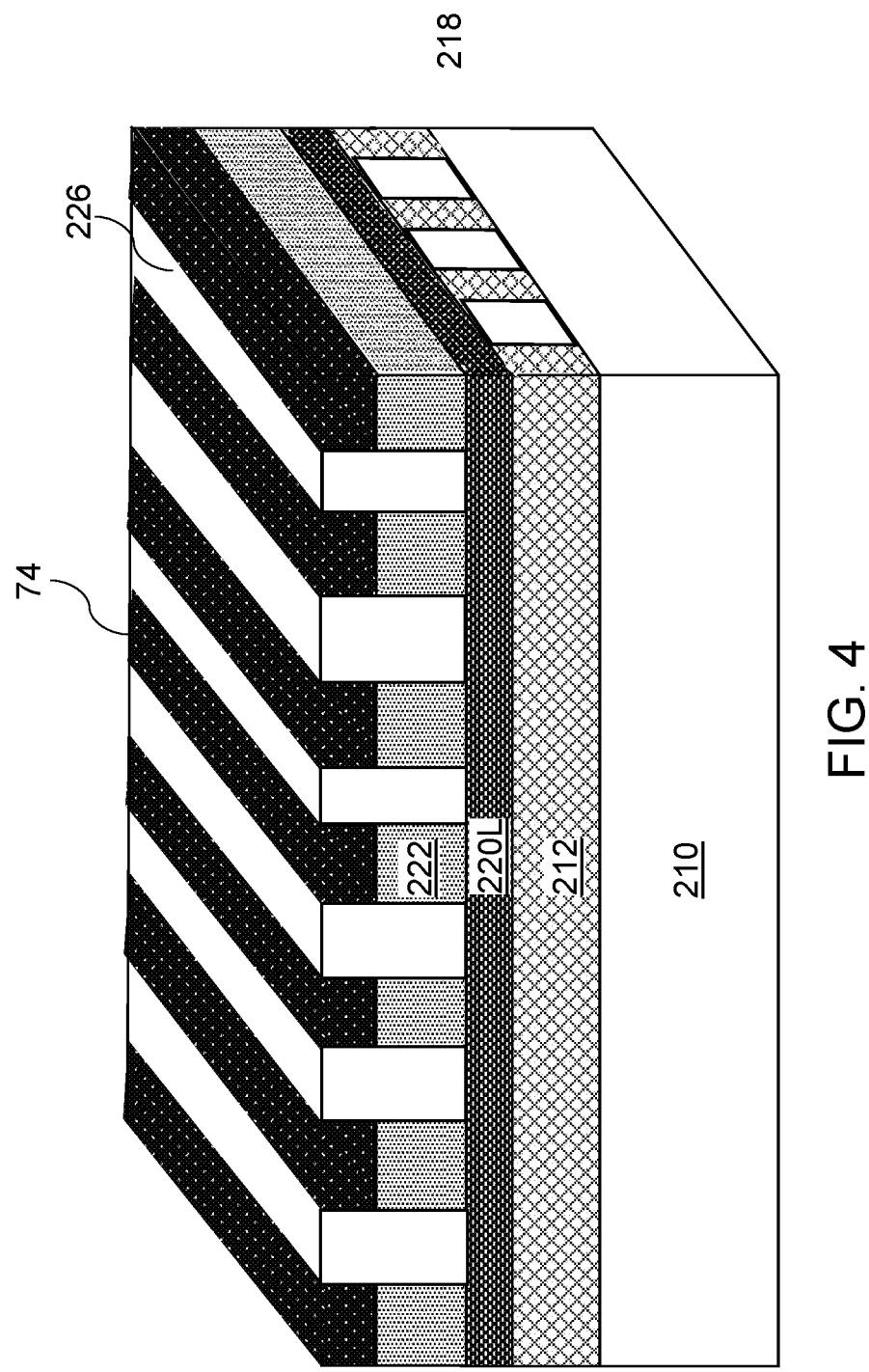
FIG. 4 is a perspective view of the memory array region after planarization of the top electrode.

FIG. 4 illustrates a perspective view of the memory array region 100 after planarization of the top electrode rails 222. As may been seen in FIG. 4, the continuous high-k dielectric memory layer 220L of the exemplary memory device spans the full length and width of the memory array region 100. That is, the array of memory cells 95 in the memory array region 100 share a common continuous high-k dielectric layer 220L rather than each memory cell 95 having a discrete memory portion. Additionally, the exemplary memory device includes bottom electrode rails 212 and top electrode rails 222 that may horizontally oriented in different first and second horizontal directions. In an embodiment, the first and second horizontal directions may be orthogonal to each other.

Figure 5:
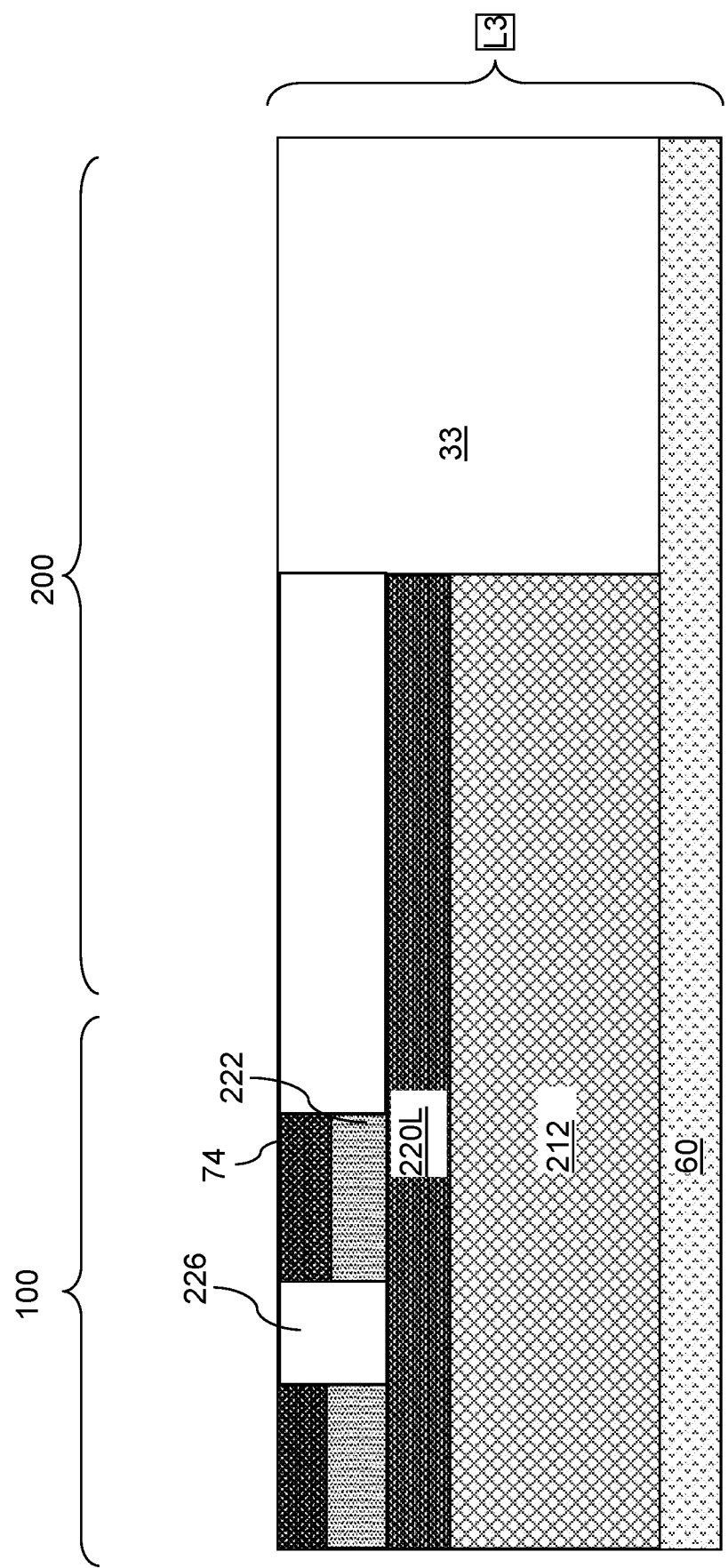
FIG. 5 is a vertical cross-sectional view of a portion of the exemplary structure around a boundary between a memory array region and the peripheral region.

Referring to FIG. 5, a vertical cross section of the memory array region 100 as completed in FIG. 4 above is shown adjacent the peripheral region 200 as part of the third interconnect-level structure L3. Also shown in FIG. 5 in the peripheral region 200 is the third interconnect level dielectric layer 33.

Figure 6:
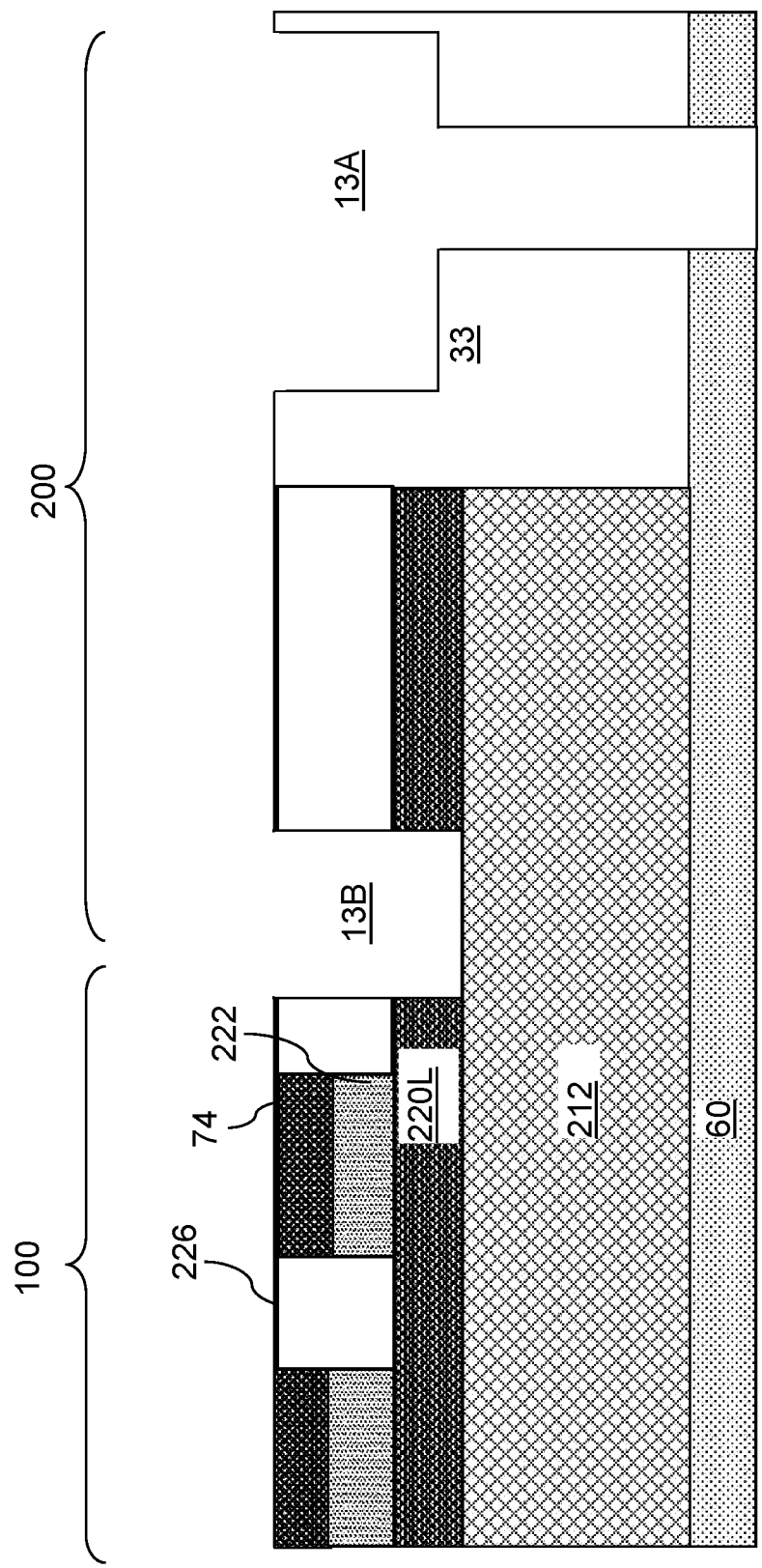
FIG. 6 is a vertical cross-sectional view of a portion of the exemplary structure around a boundary between a memory array region and the peripheral region after formation of various cavities in an interconnect-level dielectric layer according to an embodiment of the present disclosure.

Referring to FIG. 6, combinations of a lithographic patterning process and an anisotropic etch process can be employed to form various cavities (13A, 13B) through the third interconnect-level dielectric layer 33, and/or the etch stop layer 60. For example, a combination of a first lithographic patterning process and a first anisotropic etch process may be used to form via cavities (13A, 13B), and a combination of a second lithographic patterning process and a second anisotropic etch process can be employed to form line cavities that overlap in area with the via cavities and to vertically extend the via cavities to a respective underlying etch stop structure. The various cavities (13A, 13B) may include first integrated line and via cavities 13A under which a top surface of a respective second metal line 42L may be physically exposed and a second integrated line and via cavities 13B under which a top surface of a respective bottom electrode rail 212 is exposed.

Figure 7:
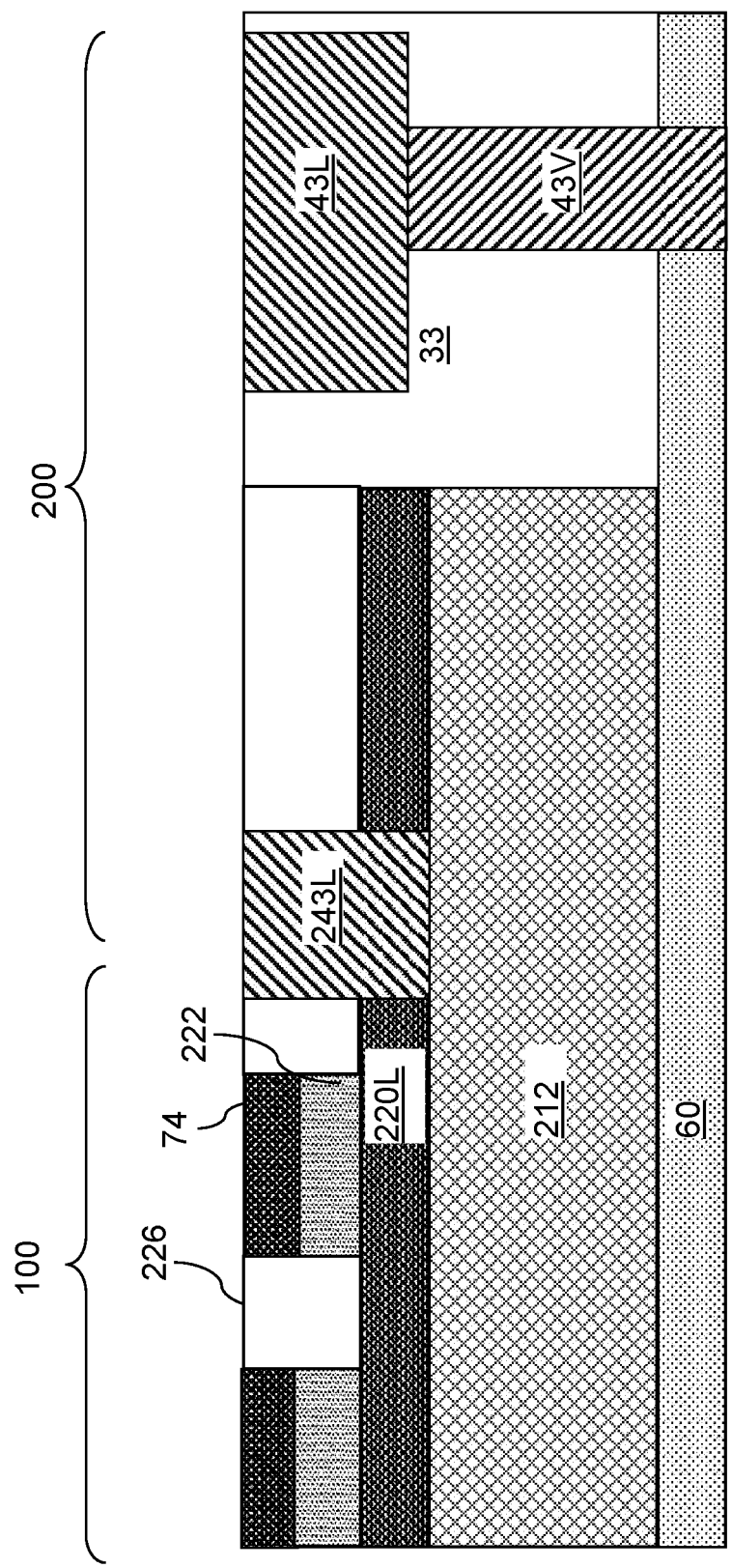
FIG. 7 is a vertical cross-sectional view of a portion of the exemplary structure around a boundary between a memory array region and the peripheral region after formation of metal interconnect structures in the cavities according to an embodiment of the present disclosure.

Referring to FIG. 7, at least one conductive material can be deposited in each of the cavities (13A, 13B) in the third interconnect-level dielectric layer 33, and/or the middle etch stop layer 60. The at least one conductive material can include a metallic nitride liner (such as a layer of TiN, TaN, or WN) and a metallic fill material (such as copper or tungsten). Excess portions of the at least one material can be removed from above the horizontal plane including the top surface of the third interconnect-level dielectric layer 33 by a planarization process such as chemical mechanical planarization.

Each remaining portion of the at least one conductive material filling the first integrated line and via cavities 13A constitutes an integrated line and via structure that include a second metal via structure 43V as a vertically-extending portion and a third metal line 43L as a horizontally-extending portion. Each remaining portion of the at least one conductive material filling the second integrated line and via cavities 13B constitutes an integrated line and via structure, which is herein referred to as a bit line contact structure (243L). Each bit line contact structure (243L) contacts a top surface of a respective one of the bottom electrode rails 212.

Figure 8:
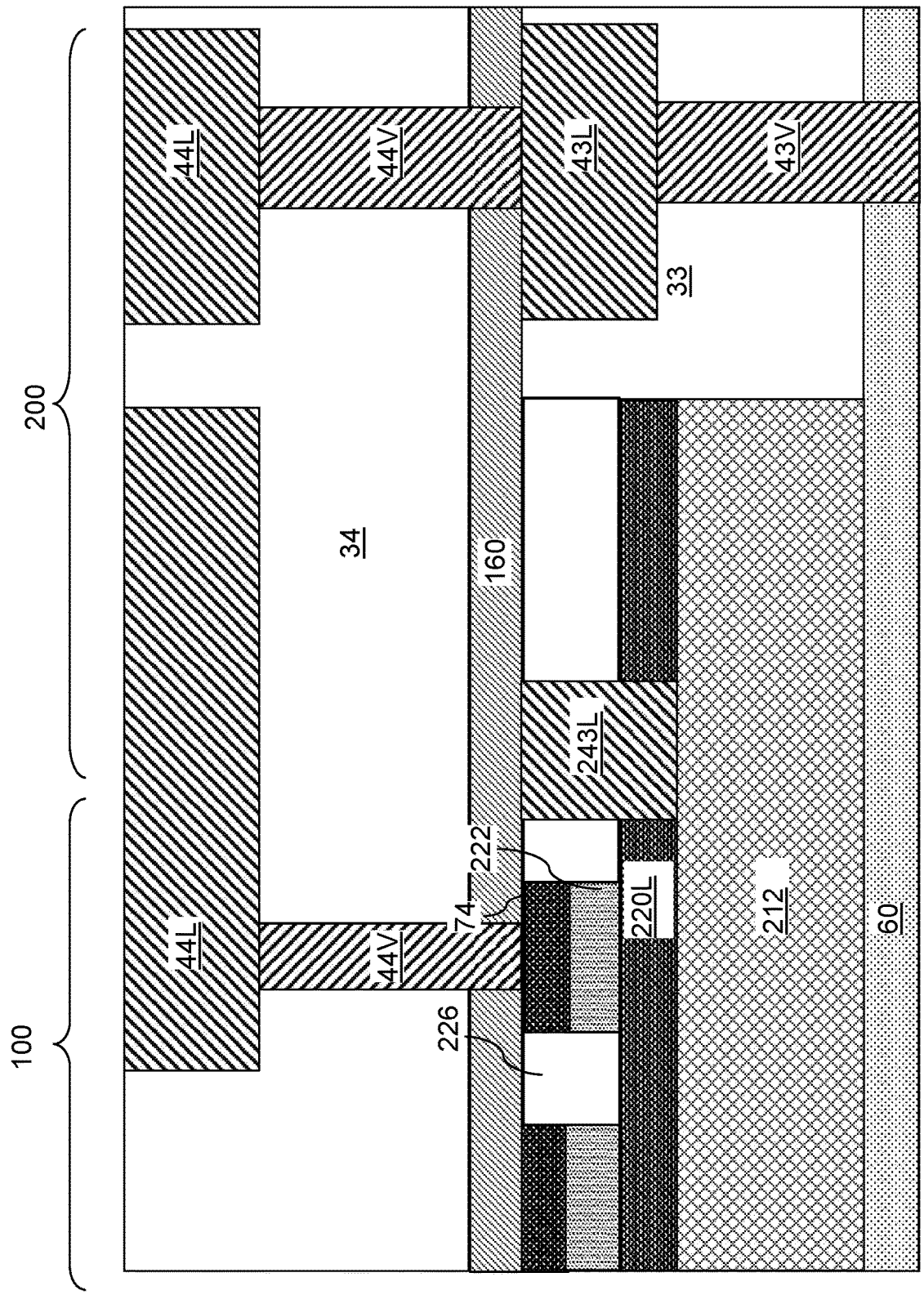
FIG. 8 is a vertical cross-sectional view of a portion of the exemplary structure around a boundary between a memory array region and the peripheral region after formation of an upper interconnect-level dielectric layer and additional metal interconnect structures according to an embodiment of the present disclosure.

Referring to FIG. 8, an additional middle etch stop dielectric layer 160 and a fourth interconnect-level dielectric layer 34 may be formed above the third interconnect-level dielectric layer 33. Fourth interconnect-level metal interconnect structures (44V, 44L) may be formed through the fourth interconnect-level dielectric layer 34 and the additional middle etch stop dielectric layer 160. The fourth interconnect-level metal interconnect structures (44V, 44L) can include third metal via structures 44V and fourth metal lines 44L. The third metal via structures 44 can contact a top surface of a respective one of the third metal lines 43L and the top electrode rails 222 or selector material layer 74 if located on top of the top electrode rails 222. Subsequently, additional processing steps described above can be performed to provide the first exemplary structure illustrated in FIG. 1C.

Figure 9:
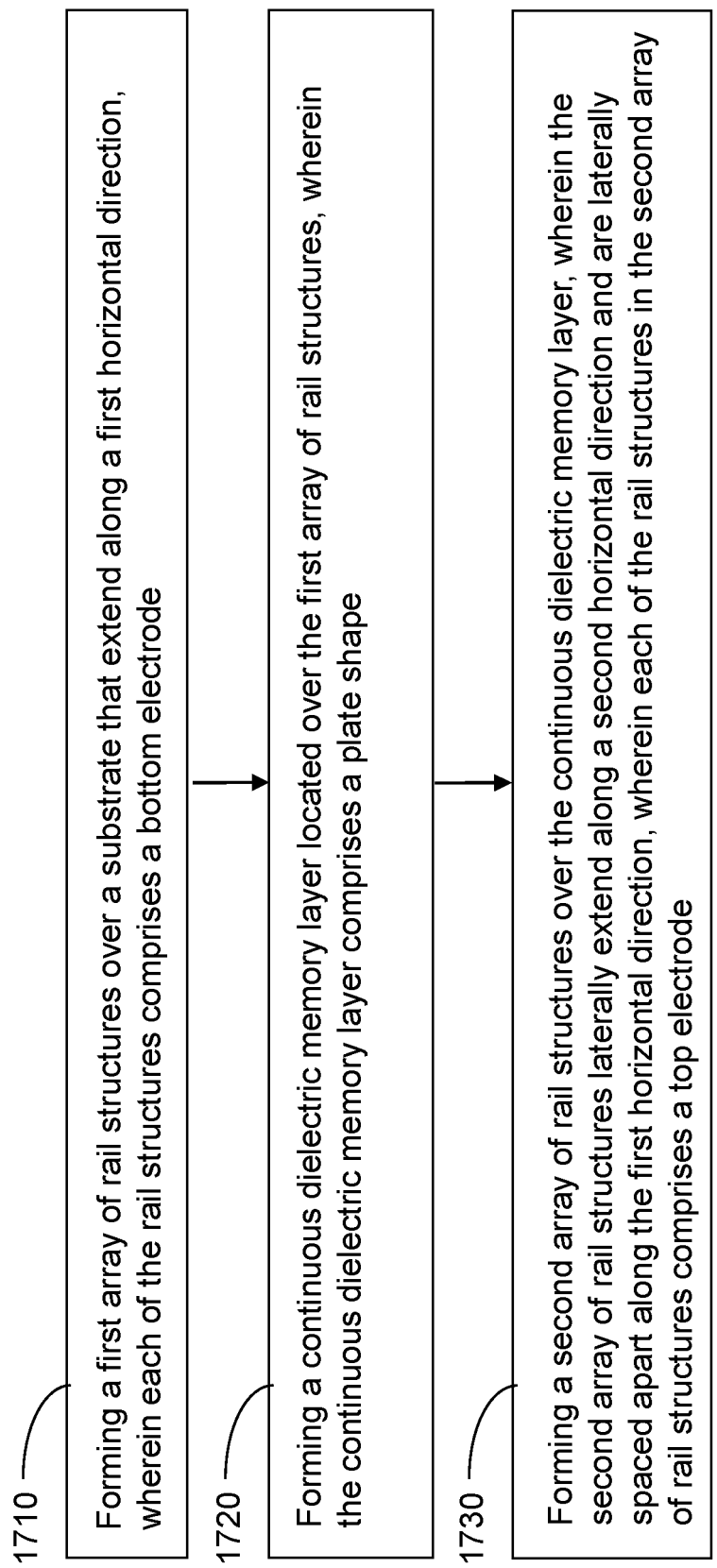
FIG. 9 is a flowchart that illustrates the general processing steps of the methods of the present disclosure.

Referring to FIG. 9, a flowchart illustrates a general method of forming at least one resistive memory array 95 over a substrate 8 according to an embodiment of the present disclosure. Each of the at least one resistive memory array 95 may be formed by performing a set of processing steps illustrated in the flow chart. Referring to step 1710, a first array of rail structures 212 may be formed over a substrate that extend along a first horizontal direction, wherein each of the rail structures comprises a bottom electrode. Referring to step 1720, a continuous dielectric memory layer 220L located over the first array of rail structures 212 is formed, wherein the continuous dielectric memory layer 220L comprises a plate shape that spans a full length and width of the first array 101 of rail structures 212 and a second array 201 of rail structures 222. By forming a continuous high-k dielectric memory layer 220L that spans the full length and width of the memory array region 100 cell leakage current between the top and bottom electrode may be prevented. That is, the array of memory cells 95 in the memory array region 100 share a common continuous high-k dielectric layer 220L rather than each memory cell in the array of memory cells 95 having a discrete memory portion. Referring to step 1730, a second array 201 of rail structures 222 over the continuous dielectric memory layer 220L may be formed. The second array 201 of rail structures 222 laterally extend along a second horizontal direction and are laterally spaced apart along the first horizontal direction. Further, each of the rail structures 222 in the second array 201 of rail structures 222 comprises a top electrode.

Generally, the structures and methods of the present disclosure can be used to form at least one layer of a two-dimensional array of resistive memory elements in a metal interconnect level. The resistive memory includes a continuous layer of a high-k dielectric material which has a plate shape that spans the full length and width of the rows of word lines and columns of bit lines. The use of a continuous plate shaped dielectric material layer allows for the fabrication of memory devices with low cell leakage while also providing a high cell density than previously attainable. In particular, by eliminating the step of anisotropically etching the continuous resistive material layer, the sputtering of bottom electrode material on to sidewalls of discrete resistive material elements and real-estate consuming sidewalls of the top electrode rails may be eliminated, thereby reducing leakage current without resorting to the use of sidewall spacers on the sidewalls of the top electrode rails.

An embodiment is drawn to a memory device including a first array 101 of rail structures 212 that extend along a first horizontal direction and are laterally spaced apart along a second horizontal direction. Each of the rail structures of the first array 101 comprises a bottom electrode 212, and a second array 201 of rail structures 222 that laterally extend along a second horizontal direction and are laterally spaced apart along the first horizontal direction. Each of the rail structures 222 of the second array 201 of rail structures 222 comprises a top electrode. The memory device also includes a continuous dielectric memory layer 220L located between the first array 101 of rail structures 212 and the second array 201 of rail structures 222, wherein the continuous dielectric memory layer 220L spans the full length and width of the first array 101 of rail structures 212 and the second array 201 of rail structures 222.

Another embodiment is drawn to at least two adjacent resistive random access memory cells, wherein each of the at least two adjacent resistive random access memory cells includes a first rail structure 212 that extend along a first horizontal direction and is laterally spaced apart from an adjacent first rail structure 212 along a second horizontal direction. Each of the first rail structures 212 comprises a bottom electrode. Each of the at least two memory cells also includes and a second rail structure 222 that laterally extends along the second horizontal direction and is laterally spaced apart from an adjacent second rail structure 222 along the first horizontal direction. Each of the second rail structures 222 comprises a top electrode. The resistive random access memory device also includes a continuous dielectric memory layer 220L formed between the first rail structures 212 and the second rail structures 222. The continuous dielectric memory layer 220L comprises a resistive switching material and spans the full length and width of the first rail structures 212 and the second rail structures 222.

Another embodiment is drawn to a method of forming memory device including forming a first array 101 of rail structures 212 over a substrate 10 that extend along a first horizontal direction in which each of the rail structures 212 of the first array comprises a bottom electrode and forming a continuous dielectric memory layer 220L located over the first array 101 of rail structures 212 in which the continuous dielectric memory layer 220L comprises a plate shape that spans the full length and width of the first array 101 of rail structures 212 and a second array 201 of rail structures 222. The method also includes forming the second array 201 of rail structures 222 over the continuous dielectric memory layer 220L. The second array 201 of rail structures 222 laterally extend along a second horizontal direction and are laterally spaced apart along the first horizontal direction. Each of the rail structures of the second array 201 of rail structures 222 comprises a top electrode 222.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first array of rail structures that extend along a first horizontal direction and are laterally spaced apart along a second horizontal direction, wherein each of the rail structures of the first array comprises a bottom electrode;
   a second array of rail structures that laterally extend along the second horizontal direction and are laterally spaced apart along the first horizontal direction, wherein each of the rail structures of the second array comprises a top electrode; and
   a continuous dielectric memory layer located between the first array of rail structures and the second array of rail structures, wherein the continuous dielectric memory layer spans a full length and a full width of the first array of rail structures and spans a full length and a full width of the second array of rail structures,
   wherein the bottom electrode is directly connected to a respective metal interconnect structure formed above the bottom electrode.

2. The memory device of claim 1, wherein the continuous dielectric memory layer comprises alumina ($Al_2O_3$), hafnia ($HfO_2$), zirconia ($ZrO_2$), titanium dioxide ($TiO_2$), tantalum oxide ($Ta_2O_5$) and SZO ($SrZrO_3$).

3. The memory device of claim 2, wherein the top electrode or the bottom electrode further comprises a selector material layer located between the continuous dielectric memory layer and a top surface of the bottom electrode or between the continuous dielectric memory layer and a bottom surface of the top electrode.

4. The memory device of claim 1, wherein the continuous dielectric memory layer comprises a high-k dielectric memory material.

5. The memory device of claim 1, wherein a least one of the first array of rail structures comprises a conductive material selected from TiN, W, TaN, Ti, Mo, Ru, Ni and mixtures thereof and at least one of the second array of rail structures comprises a conductive material selected from TiN, W, TaN, Ti, Mo, Ru, Ni and mixtures thereof.

6. The memory device of claim 1, further comprising:
   bit lines electrically connected to one of the bottom electrodes or the top electrodes; and
   word lines electrically connected to the other of the bottom electrodes or the top electrodes.

7. At least two adjacent resistive random access memory cells:
   wherein:
      each of the at least two adjacent resistive random access memory cells comprises a first rail structure that extends along a first horizontal direction and is laterally spaced apart from an adjacent first rail structure along a second horizontal direction, wherein each of the first rail structures comprises a bottom electrode;
      each of the at least two memory cells comprises a second rail structure that laterally extends along the second horizontal direction and is laterally spaced apart from an adjacent second rail structure along the first horizontal direction, wherein each of the second rail structures comprises a top electrode;
      a continuous dielectric memory layer formed between the first rail structures and the second rail structures, wherein the continuous dielectric memory layer comprises a resistive switching material and spans a full length and width of the first rail structures and the second rail structures, and
      at least one of the bottom electrode and the top electrode is electrically connected to a respective metal interconnect structure formed above the at least one of the bottom electrode and the top electrode.

8. The resistive random access memory device at least two adjacent resistive random access memory cells of claim 7, wherein the resistive switching material comprises alumina ($Al_2O_3$), hafnia ($HfO_2$), zirconia ($ZrO_2$), titanium dioxide ($TiO_2$), tantalum oxide ($Ta_2O_5$) and SZO ($SrZrO_3$).

9. The at least two adjacent resistive random access memory cells of claim 7, wherein the at least two adjacent resistive random access memory cells
   are formed over two levels of metal interconnect structures over a substrate.

10. A method of forming a memory device, comprising:
    forming a first array of rail structures over a substrate that extend along a first horizontal direction;
    forming a continuous dielectric memory layer located over the first array of rail structures;
    forming a second array of rail structures over the continuous dielectric memory layer, wherein the second array of rail structures laterally extend along a second horizontal direction and are laterally spaced apart along the first horizontal direction, wherein:
the continuous dielectric memory layer comprises a plate shape that spans a full length and width of the first array of rail structures and a second array of rail structures,
each of the rail structures in the first array of rails structures comprises a bottom electrode, and
each of the rail structures in the second array of rails structures comprises a top electrode; and
directly connecting at least one of the bottom electrode and the top electrode to a respective metal interconnect structure formed above the at least one of the bottom electrode and the top electrode.

11. A memory device, comprising:
bottom electrode rails that extend along a first horizontal direction and are laterally spaced apart along a second horizontal direction;
top electrode rails that laterally extend along the second horizontal direction and are laterally spaced apart along the first horizontal direction;
a continuous dielectric memory layer located between the bottom electrode rails and the top electrode rails, wherein the continuous dielectric memory layer spans a full length and a full width of the bottom electrode rails and spans a full length and a full width of the top electrode rails; and
bit line contact structures vertically extending through the continuous dielectric memory layer and contacting a top surface of a respective one of the bottom electrode rails.

12. The memory device of claim 11, further comprising dielectric material rails laterally extending along the second horizontal direction and interlaced with the top electrode rails along the first horizontal direction.

13. The memory device of claim 12, further comprising selector material rails laterally extending along the second horizontal direction and having a same area as a respective one of the top electrode rails and contacting a horizontal surface of the respective one of the top electrode rails.

14. The memory device of claim 13, wherein each of the selector material rails overlies the respective one of the top electrode rails and has a respective top surface located within a same horizontal plane as top surfaces of the dielectric material rails.

15. The memory device of claim 14, further comprising:
an interconnect-level dielectric layer overlying the selector material rails; and
metal via structures vertically extending through the interconnect-level dielectric layer and contacting a top surface of a respective one of the selector material rails.

16. The memory device of claim 13, wherein each of the selector material rails underlies the respective one of the top electrode rails, and each of the top electrode rails has a respective top surface located within a same horizontal plane as top surfaces of the dielectric material rails.

17. The memory device of claim 12, further comprising a dielectric material portion having a same material composition as, and having a same thickness as, the dielectric material rails, and having a top surface within a horizontal plane that contains top surfaces of the dielectric material rails,
wherein the bit line contact via structures vertically extend through the dielectric material portion, and
wherein top surfaces of the bit line contact via structures are located within the horizontal plane that contains the top surfaces of the dielectric material portion.

18. The memory device of claim 12, further comprising:
an interconnect level dielectric layer having a top surface within a horizontal plane including top surfaces of the dielectric material rails; and
an integrated line and via structure embedded within the interconnect level dielectric layer and having a top surface located within the horizontal plane.

19. The memory device of claim 17, further comprising an etch stop layer underlying, and contacting bottom surfaces of, the bottom electrode rails, wherein a metal via structure within the integrated line and via structure vertically extends through the etch stop layer.

* * * * *